(12) United States Patent
Boccard et al.

(10) Patent No.: US 11,919,817 B2
(45) Date of Patent: *Mar. 5, 2024

(54) MANUFACTURE OF A CERAMIC COMPONENT

(71) Applicant: ROLEX SA, Geneva (CH)

(72) Inventors: Cyriaque Boccard, Douvaine (FR); Ollivier Pujol, Lausanne (CH)

(73) Assignee: ROLEX SA, Geneva (CH)

( * ) Notice: Subject to any disclaimer, the term of this patent is extended or adjusted under 35 U.S.C. 154(b) by 856 days.

This patent is subject to a terminal disclaimer.

(21) Appl. No.: 16/605,598

(22) PCT Filed: Apr. 16, 2018

(86) PCT No.: PCT/EP2018/059691
§ 371 (c)(1),
(2) Date: Oct. 16, 2019

(87) PCT Pub. No.: WO2018/192885
PCT Pub. Date: Oct. 25, 2018

(65) Prior Publication Data
US 2020/0115288 A1 Apr. 16, 2020

(30) Foreign Application Priority Data
Apr. 20, 2017 (EP) .................................. 17167229

(51) Int. Cl.
*C04B 35/628* (2006.01)
*A44C 27/00* (2006.01)
(Continued)

(52) U.S. Cl.
CPC ...... *C04B 35/62884* (2013.01); *A44C 27/001* (2013.01); *C04B 35/119* (2013.01);
(Continued)

(58) Field of Classification Search
CPC ..................... C23C 16/45525; C23C 14/223
See application file for complete search history.

(56) References Cited

U.S. PATENT DOCUMENTS 4,940,523 A 7/1990 Takeshima
5,928,977 A 7/1999 Magnin et al.
(Continued)

FOREIGN PATENT DOCUMENTS

CN 1193617 A 9/1998
CN 1972880 A 5/2007
(Continued)

OTHER PUBLICATIONS

Office Action dated Feb. 1, 2022, issued in counterpart JP Application No. 2019-556851, with English translation. (12 pages).
(Continued)

*Primary Examiner* — Joseph A Miller, Jr.
(74) *Attorney, Agent, or Firm* — WHDA, LLP

(57) ABSTRACT

A process for manufacturing a ceramic powder with binder includes at least one additional element or compound, the ceramic powder with binder being in particular based on zirconia and/or alumina and/or strontium aluminate, wherein the process includes a step (E3) of depositing at least one additional element or compound on a ceramic powder with binder by a physical vapour deposition (PVD) and/or by a chemical vapour deposition (CVD) and/or by an atomic layer deposition (ALD).

18 Claims, 7 Drawing Sheets

| Constituants | | REF1 | 1-ALD 50 | 2-ALD 200 |
|---|---|---|---|---|
| ZrO$_2$ stab. - TZ3Y (wt%) | | 99.75 | 99.62 | 98.75 |
| Al$_2$O$_3$ (wt%) | | 0.25 | 0.25 | 0.25 |
| Pt (wt%) | | 0 | 0.13 | 1.0 |
| CIEL*a*b* | L* | 47.7 | 46.1 | 75.05 |
| | a* | 0.7 | 0.4 | 0.19 |
| | b* | 0.5 | 0 | -0.29 |

(51) Int. Cl.

| | | |
|---|---|---|
| *C04B 35/119* | (2006.01) | |
| *C04B 35/44* | (2006.01) | |
| *C04B 35/48* | (2006.01) | |
| *C04B 35/634* | (2006.01) | |
| *C04B 35/638* | (2006.01) | |
| *C04B 35/64* | (2006.01) | |
| *C22C 29/12* | (2006.01) | |
| *C23C 14/22* | (2006.01) | |
| *C23C 16/44* | (2006.01) | |
| *C23C 16/455* | (2006.01) | |

(52) U.S. Cl.
CPC .............. *C04B 35/44* (2013.01); *C04B 35/48* (2013.01); *C04B 35/62842* (2013.01); *C04B 35/62894* (2013.01); *C04B 35/63416* (2013.01); *C04B 35/63488* (2013.01); *C04B 35/638* (2013.01); *C04B 35/64* (2013.01); *C22C 29/12* (2013.01); *C23C 14/223* (2013.01); *C23C 16/4417* (2013.01); *C23C 16/45525* (2013.01); *C04B 2235/3246* (2013.01); *C04B 2235/40* (2013.01); *C04B 2235/408* (2013.01); *C04B 2235/9661* (2013.01)

(56) References Cited

U.S. PATENT DOCUMENTS

| | | | | |
|---|---|---|---|---|
| 6,613,383 | B1* | 9/2003 | George | C04B 41/009 428/404 |
| 2002/0106461 | A1* | 8/2002 | Talton | A61K 9/5089 427/596 |
| 2003/0026989 | A1 | 2/2003 | George et al. | |
| 2008/0160193 | A1* | 7/2008 | Mitchell | C23C 16/45525 427/255.19 |
| 2010/0240519 | A1 | 9/2010 | Nakasuga et al. | |
| 2013/0072373 | A1 | 3/2013 | Pujol et al. | |
| 2015/0307406 | A1 | 10/2015 | Pujol et al. | |
| 2019/0006697 | A1* | 1/2019 | Danko | H01M 4/0426 |
| 2019/0040521 | A1* | 2/2019 | Vieluf | C23C 14/24 |

FOREIGN PATENT DOCUMENTS

| | | | |
|---|---|---|---|
| CN | 102947245 | A | 2/2013 |
| CN | 106011791 | A | 10/2016 |
| EP | 0 345 795 | A1 | 12/1989 |
| EP | 2 746 242 | A1 | 6/2014 |
| EP | 2 746 243 | A1 | 6/2014 |
| GB | 2501763 | A | 11/2013 |
| JP | 56-130469 | A | 10/1981 |
| JP | S62-59571 | A | 3/1987 |
| JP | 5-270820 | A | 10/1993 |
| JP | 2005-501176 | A | 1/2005 |
| WO | 2003/008186 | A1 | 1/2003 |
| WO | 2007/108416 | A1 | 9/2007 |
| WO | 2016/147208 | A1 | 9/2016 |
| WO | WO2017/125418 | * | 6/2018 |

OTHER PUBLICATIONS

Office Action dated Jan. 11, 2022, issued in counterpart JP Application No. 2019-556880, with English translation. (12 pages).
Office Action dated Oct. 9, 2021, issued in counterpart CN application No. 201880026157.8, with English translation. (20 pages).
Office Action dated Oct. 8, 2021, issued in counterpart CN application No. 201880026191.5, with English translation. (18 pages).
Office Action dated Mar. 29, 2021, issued in counterpart EP application No. 18 717 376.0. (6 pages).
Itoh et al., "Microstructure and properties of the sintered composite prepared by hot pressing of TiN-coated alumina powder", Journal of Materials Science, vol. 28, No. 24, 1993, pp. 6761-6766; cited in the International Search Report.
Ensinger et al., "Noble metal deposition on aluminum oxide powder surfaces by ion beam sputtering", Nuclear Instruments and Methods in Physics Research B, vol. 141, No. 1-4, 1998, pp. 693-698; cited in the International Search Report.
Brust et al., "CVE Coating of Oxide Particles for the Production of Novel Particle-Reinforced Iron-Based Metal Matrix Composites", Open Journal of Applied Sciences, vol. 6, No. 4, 2016, pp. 260-269; cited in the International Search Report.
McCormick et al., "Rotary reactor for atomic layer deposition on large quantities of nanoparticles", J. Vac. Science Technology: Part A, vol. 25, No. 1, pp. 67-74; cited in the International Search Report.
International Search Report and Written Opinion dated Jul. 5, 2018 issued in corresponding application No. PCT/EP2018/059691; w/ English partial translation and partial machine translation (27 pages).

* cited by examiner

| Constituents | | REF1 | 1 | 2 | 3 | 4 | 5 | 6 | 7 |
|---|---|---|---|---|---|---|---|---|---|
| ZrO$_2$ stab.- TZ3Y (wt%) | | 99.75 | 97.50 | 99.64 | 97.50 | 99.64 | 99.917 | 99.944 | 99.978 |
| Al$_2$O$_3$ (wt%) | | 0.25 | 0.24 | 0.25 | 0.24 | 0.25 | 0.008 | 0.006 | 0.002 |
| Pt (wt%) | | 0 | 2.26 | 0.11 | 2.26 | 0.11 | 0.075 | 0.05 | 0.02 |
| CIEL*a*b* | L* | 88.423 | 47.5 | 50.8 | 46.9 | 50.3 | 64.1 | 73 | 83.2 |
| | a* | -1.187 | 0.2 | 0.1 | 0.3 | 0.2 | 0.2 | 0.1 | 0 |
| | b* | -1.567 | -0.2 | -0.9 | 0 | -0.6 | -0.6 | -0.2 | 0.6 |

| Constituants | | 509A 15 | 427A 16 | 302D 17 | 302C 18 | 302B 19 | 227E 20 | 229A 21 | 229B 22 | 301B 23 | 229C 24 | 301A 25 | 302E 26 | 503A 27 | 303B 28 | 303C 29 | 304A 30 |
|---|---|---|---|---|---|---|---|---|---|---|---|---|---|---|---|---|---|
| $ZrO_2$ stab. - TZ3Y (wt%) | | 100 | 100 | 98 | 98 | 98 | 100 | 98 | 98 | 98 | 98 | 98 | 100 | 100 | 98 | 98 | 98 |
| $Al_2O_3$ (wt%) | | 0 | 0 | 2 | 2 | 2 | 0 | 2 | 2 | 2 | 2 | 2 | 0 | 0 | 2 | 2 | 2 |
| Add. element | Fe | X | | | | | | | | | | | | | | | |
| | Cr | | X | X | X | X | | | | | | | | | | | |
| | V | | | | | | | X | | | | | | | | | |
| | Al | | | | | | | X | X | | | | | | | | |
| | Ti | | | | | | | | | X | X | X | X | X | | | |
| | Cu | | | | | | | | | | | | | | X | X | |
| | Co/Si - 33/66 at% | | | | | | | | | | | | | | | | X |
| CIEL*a*b* | L* | 84.5 | 68.5 | 80.3 | 79.9 | 80.1 | 90 | 93.4 | 94.0 | 93.7 | 93.7 | 74.1 | 75.4 | 85.4 | 77.2 | 78.8 | 93.8 |
| | a* | -0.8 | 2.9 | 4.3 | 4.3 | 4.1 | -3.2 | -0.9 | -0.3 | -0.4 | -0.5 | 2.9 | 2.1 | -7.1 | -9.8 | -0.8 | -0.8 |
| | b* | 7.8 | 8.4 | 4.3 | 3.8 | 4.1 | 25.1 | 0.9 | 1.2 | 1.0 | 1.4 | 7.1 | 6.4 | -2.1 | 2.8 | -2.5 | 1.0 |

| Constituants | | REF2 | 8 | REF3 | 9 | 10 |
|---|---|---|---|---|---|---|
| $ZrO_2$ stab. - TZ3Y (wt%) | | 99 | 98.98 | 99.5 | 99.48 | 99.464 |
| $CoAl_2O_4$ (wt%) | | 1 | 1 | 0.5 | 0.5 | 0.5 |
| Pt (wt%) | | 0 | 0.02 | 0 | 0.02 | 0.036 |
| CIEL*a*b* | L* | 50.5 | 48.8 | 52.0 | 50.2 | 49.3 |
| | a* | -0.7 | -1.7 | -1.9 | -1.8 | -1.5 |
| | b* | -19.4 | -12.6 | -15.5 | -9.9 | -7.8 |

| Constituants | | REF4 | 11 |
|---|---|---|---|
| $ZrO_2$ stab.- TZ3Y (wt%) | | 70 | 69.98 |
| $Sr_4Al_{14}O_{25}$:Dy,Eu (wt%) | | 30 | 30 |
| Pt (wt%) | | 0 | 0.02 |
| CIEL*a*b* | L* | 94.0 | 49.3 |
| | a* | -4.7 | 0.4 |
| | b* | 6.7 | 2.5 |

| Constituants | | REF1 | 1-ALD 50 | 2-ALD 200 |
|---|---|---|---|---|
| $ZrO_2$ stab. - TZ3Y (wt%) | | 99.75 | 99.62 | 98.75 |
| $Al_2O_3$ (wt%) | | 0.25 | 0.25 | 0.25 |
| Pt (wt%) | | 0 | 0.13 | 1.0 |
| CIEL*a*b* | L* | 47.7 | 46.1 | 75.05 |
| | a* | 0.7 | 0.4 | 0.19 |
| | b* | 0.5 | 0 | -0.29 |

MANUFACTURE OF A CERAMIC COMPONENT

The present invention relates to a process for manufacturing a ceramic powder and a ceramic component. Such a ceramic powder and component find applications in watchmaking and jewellery. Particularly, such a component finds applications in a timepiece, in particular for decorative components such as a bezel, or functional components such as movement parts.

PRIOR ART

In the field of watchmaking, just as in jewellery, it is known to use ceramic components, in particular decorative components. However, one limiting factor in the use of these ceramic components stems from the fact that it is difficult, or even impossible, to obtain certain colours, in particular certain grey hues, and the difficulty in obtaining an even, predictable and reproducible colour. Furthermore, obtaining a particular hue requires the production of an entire batch of material from the initial components, and proves time-consuming and complex.

Another limiting factor also stems from the fact that it is difficult to test the effect of adding certain elements, which can be combined with the constituents of known ceramics, in particular to obtain certain particular mechanical characteristics of the ceramic component. Here, too, each test is complex and requires the production of an entire batch of material from the initial constituents.

The usual process for manufacturing a ceramic component comprises a first phase that consists in preparing the raw material, i.e. the ceramic powder, such as for example a ceramic powder based on zirconia and/or alumina. In this first phase, this raw material is generally prepared in the form of a ceramic powder to which it is possible to add, for example, other oxides in order to strengthen the ceramic component, or pigments in order to obtain a coloured material. The pigments are generally of the metal oxide type or the rare-earth oxide type, and are added to and mixed with the base ceramic powder via a liquid route, the pigments being thus introduced using a carrier liquid.

A second phase of the process for manufacturing a ceramic component consists in incorporating a binder into the ceramic powder obtained in the first phase. Such a binder generally consists of one or more organic compounds. The nature and proportion of the binder depend on the intended process in a third phase, and at the end of this phase reference is generally made to a ceramic powder with binder.

The third phase consists of a shaping of the ceramic component. To that end, a first approach comprises a step of pressing an agglomerate of particles with binder obtained at the end of the second phase: in such a process, the second phase prepares a ceramic powder with binder in the form of spray-dried pressing granules. A second approach consists of a shaping by injection moulding. In such a case, the preparation resulting from the second phase is a ceramic powder with binder referred to as "feedstock". A third approach consists of a shaping by casting in a mould, commonly referred to as slip casting. In such a case, the preparation resulting from the second phase is a ceramic powder with binder in suspension, referred to as slip or also "slurry". At the end of the third phase, the ceramic component has a shape which is close to its final shape and contains both the ceramic powder and the binder. Other shaping techniques such as gel casting, freeze casting or else coagulation casting techniques may be used.

A fourth phase allows the ceramic component to be finished. This fourth phase comprises a first step that consists in debinding the component, i.e. eliminating the binder, for example via a heat treatment or using a solvent. A second step allows the component to be compacted, eliminating the pores arising from the binder removal. This second step generally consists of a sintering heat treatment (firing at high temperature). The final colour of the ceramic component, and also its final mechanical properties, appear only at the end of this fourth phase and are derived from the reactions between the various constituents of the component and also from the atmosphere present in the furnace, which come into play during the heat treatment. These reactions are complex and sometimes unpredictable.

It is observed that the conventional process for manufacturing a ceramic component, recalled above, has several drawbacks. Particularly, the colour and the final properties obtained are dependent on numerous parameters such as the microstructure of the powder formed in the first phase, in particular the size of the grains of ceramic, the size of the pigments, their reactivity with the ceramic and the sintering environment, etc. The properties are further dependent on all of the other factors linked to the other manufacturing phases, such as the size and number of pores in the final component, the composition of the grain boundaries, the density, the percentage of the pigment(s) and their distribution within the matrix, their possible combination with one another or with the constituents of the ceramic raw material or the atmosphere during the sintering, the chemical purity of the initial compounds and the possible presence of intrinsic and extrinsic contaminants. This multiplicity of parameters to be taken into account makes it difficult to predict and reproduce a certain colour that it is desired to manufacture. This observation is even more true if the amount of colouring pigments is small: thus, to lessen this drawback, all the existing processes necessarily use a large amount of pigments. Furthermore, certain processes attempt to improve the result by adding steps based on complex chemistry, which naturally has the drawback of further complicating the manufacturing process.

What is more, the difficulty in managing the colours of a ceramic component leads, in practice, to the need for numerous tests, comprising the production of numerous complete samples, from the preparation of the ceramic powder up to the final shaping, while varying some of the abovementioned parameters for each sample in order to determine the optimal process. Furthermore, when it is desired to modify a colour, even slightly, it is necessary to restart the entire process, including, once again, preparing numerous samples. Thus, in practice, the search for a controlled colour of a ceramic component, which is often necessary for the use thereof as a decorative element, requires complex and laborious development steps.

Finally, in spite of the numerous tests, it is observed to date that it appears impossible to obtain ceramic components having certain colours, in particular certain grey colours such as those defined by the CIE $L^*a^*b^*$ colour coordinates (83; 0; 0.6) and CIE $L^*a^*b^*$ colour coordinates (47; 0.2; −0.2). Generally, a colour defined for example by $a^*$ and $b^*$ parameters close to 0 and an $L^*$ parameter of less than 96, in particular a strictly grey colour, is impossible to obtain.

Thus, the general objective of the present invention is to propose a solution for manufacturing ceramic component, in particular for a timepiece, which does not have the drawbacks of the prior art.

More precisely, a first object of the present invention is to propose a solution for manufacturing a ceramic powder and a ceramic component which makes it possible to obtain a ceramic having improved properties, in particular the colour of which is controlled and/or in particular which ceramic is endowed with novel or optimized properties for example from among mechanical, thermal, electrical and tribological properties.

A second object of the present invention is to propose a solution for the simplified manufacture of a coloured ceramic component.

A third object of the present invention is to propose a grey ceramic.

A fourth object of the present invention is to propose a simple method for modifying a ceramic powder that may already be coloured in order to modify the resulting colour of the finished ceramic component.

BRIEF DESCRIPTION OF THE INVENTION

For this purpose, the invention is based on a process for manufacturing a ceramic powder with binder or a ceramic component, in particular based on zirconia and/or alumina and/or strontium aluminate, in particular for a timepiece or a jewellery part, wherein it comprises a step of depositing at least one additional element or compound on a ceramic powder with binder by a physical vapour deposition (PVD) and/or by a chemical vapour deposition (CVD) and/or by an atomic layer deposition (ALD).

The invention is more specifically defined by the claims.

BRIEF DESCRIPTION OF THE FIGURES

These objects, features and advantages of the present invention will be disclosed in detail in the following non-limiting description of a particular embodiment given with reference to the appended figures, in which.

Hereinafter, a ceramic component or powder will denote a component or powder obtained from a polycrystalline dense material mainly comprising at least one ceramic, in particular based on zirconia and/or alumina and/or strontium aluminate, for example a zirconia stabilized with yttrium oxide and/or cerium oxide and/or magnesium oxide and/or calcium oxide. A ceramic powder will denote a powder in the form of a finely divided solid, composed of fine particles of ceramic, in particular based on zirconia and/or alumina and/or strontium aluminate. In order to simplify the description, the same term of ceramic powder will be retained intentionally in a general manner fora powder mainly comprising fine particles of ceramic, but also other added elements such as for example one or more pigments, or oxides for strengthening the ceramic, such as yttrium oxide. Similarly, a ceramic component will denote a component for example obtained by sintering of such a ceramic powder. Thus, the ceramic powder or component comprises, in all cases, predominantly a component of ceramic type, i.e., at least 50% by weight of this component of ceramic type, or even at least 75%, or even at least 90%. For example, the ceramic powder or component comprises at least 50% by weight of zirconia.

In all cases, a ceramic powder contains no organic compound. The generic term "ceramic powder with binder" will denote a composite material consisting of a ceramic powder and a binder, generally consisting of one or more organic compounds, in variable proportions, and intended for the shaping of a part by pressing, by injection moulding, by casting or by other techniques.

A (pressing) granule will denote an agglomerate of ceramic powder with binder, intended to be shaped by a pressing process, for example cold or hot uniaxial pressing, or cold or hot isostatic pressing. A granule generally comprises between 1% and 4% inclusive by weight of organic compounds.

The term "injectable ceramic powder", also generally known as "feedstock", will denote a ceramic powder with binder intended to be shaped by a high- or low-pressure injection-moulding process. An injectable ceramic powder generally comprises between 12% and 25% inclusive by weight of organic compounds.

The term "slurry" will denote a ceramic powder with binder intended to be shaped by slip casting or gel casting. A slurry generally comprises between 1% and 25% inclusive by weight of organic compounds.

Figure 1:
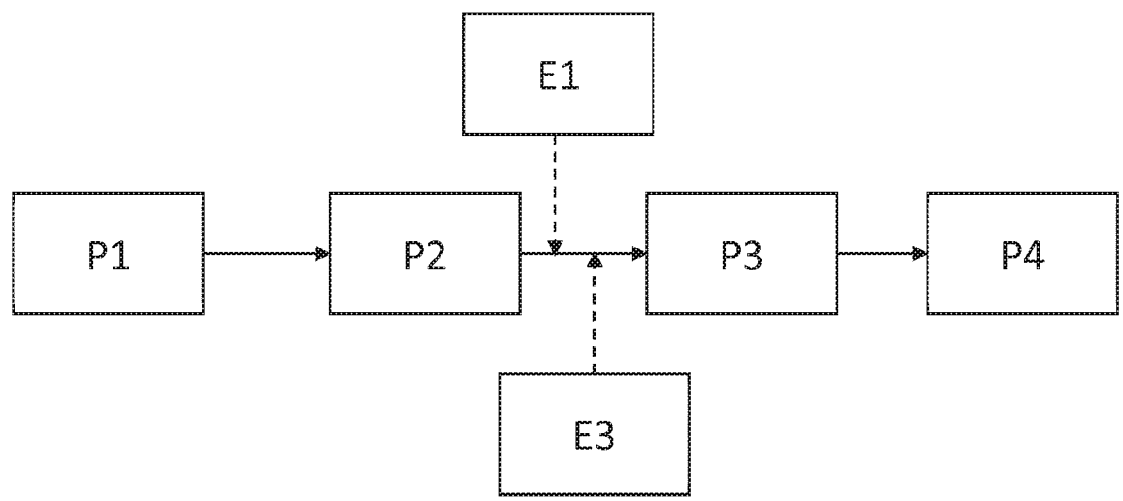
FIG. 1 schematically represents a flow chart of the steps of the process for manufacturing a coloured ceramic component for a timepiece, according to an embodiment of the present invention.

The process for manufacturing a ceramic component according to an embodiment of the invention comprises the phases and steps schematically represented by the flow chart of FIG. 1.

This manufacturing process therefore comprises the customary phases P1 to P4 of the process, namely the preparation of the ceramic powder (P1), the addition of a binder (P2), the shaping of the component (P3) and the debinding-sintering heat treatment (P4). The conventional parts of these phases will not be described in detail at this stage since they are known from the prior art. A person skilled in the art will therefore know how to implement them, including according to any existing variants or equivalences.

The embodiment of the invention differs from the conventional process in particular by the addition of a step E3 of depositing, on a ceramic powder with binder, at least one additional element or compound, for example a colouring element, via a dry route under vacuum.

According to a first embodiment variant, the deposition step E3 consists of a physical vapour deposition, known by the acronym PVD, and/or a chemical vapour deposition, known by the acronym CVD.

According to a second embodiment variant, the deposition step E3 consists of an atomic layer deposition, known by the acronym ALD.

This deposition step E3 is implemented on a ceramic powder with binder, therefore after the second phase P2 of the manufacturing process. It can therefore be implemented on a ceramic powder comprising organic compounds, for example on a granule or on injection-moulding feedstock. It is implemented before the third phase P3 of the process. In order to simplify the description, the ceramic powder with binder comprising one or more additional elements or compounds, obtained by implementation of the deposition step E3 of the invention, will continue to be referred to as ceramic powder with binder.

The additional element or compound may be very varied, particularly a metal, and/or an oxide, and/or a nitride and/or a carbide. A metal is understood to mean a pure metal or an alloy. Therefore, it may advantageously be a metal-based compound. For the sake of simplicity, the terms additional element or additional compound will be used in the remainder of the document without distinction, both for a single element and for a compound or an alloy.

Novelly, the invention also enables the use of metals which could not be used with the existing solutions, such as noble metals with a high melting point, above or equal to 1200° C., or even above or equal to 1500° C. Thus, the invention makes it possible to use, as additional element, platinum, and/or rhodium, and/or osmium, and/or palladium, and/or ruthenium, and/or iridium. As a variant, other metals may be used, and the preceding list may be supplemented by gold, aluminum, silver, rhenium, titanium, tantalum or niobium. In addition, the transition metals characterized by an incomplete d shell, according to the list below, make it possible to obtain a particularly unprecedented and advantageous result owing to their addition according to the particular deposition step E3 of the invention: iron, chromium, vanadium, manganese, cobalt, nickel and copper. Similarly, the lanthanides (La, Ce, Pr, Nd, Pm, Sm, Eu, Gd, Tb, Dy, Ho, Er, Tm, Yb and Lu) make it possible to dope the ceramic powders with binder during step E3 and to obtain advantageous colours and/or properties. As mentioned above, the additional compound may therefore be an alloy comprising or consisting of one or more of the metals and lanthanides listed above.

Thus, an additional compound may be a metal compound or alloy, obtained by the direct deposition of the metal alloy on the ceramic powder with binder or by the combination of successive or simultaneous depositions of several of the elements of the metal alloy on the ceramic powder with binder.

Similarly, an additional compound may be an oxide, a carbide or a nitride of one or more metals, obtained by the direct deposition of the oxide, carbide or nitride on the ceramic powder with binder or by the reaction of a metallic deposition with a reactive atmosphere, in particular in the deposition chamber or after the deposition, for example during a step of sintering the ceramic compound.

Naturally, several different additional elements or compounds may be used and deposited on the same ceramic powder with binder, simultaneously or successively, by one or more deposition steps E3 as described above. This increase in the additional compounds available naturally makes it possible to increase the possible colours for a ceramic, and also the other possible properties, in particular mechanical or tribological properties.

It should be noted that those skilled in the art are accustomed to adding colour pigments to a ceramic by a liquid route. They are not accustomed to do so by a dry route, or to carry out a deposition directly onto a ceramic powder with binder. During a such a dry deposition, the following parameters should be considered:
- the homogeneity of the deposition on the powders,
- the homogeneity of shape and size of the grains,
- the temperatures of the process,
- the risk of degassing,
- the electrostatic nature of the (insulating) moving divided solids,
- the finish and nature of the materials of the equipment; it is in particular necessary to correctly select the pairing between the nature of the deposition and the nature of the binders of the granules in order to prevent the powder sticking to the equipment.

For example, during a PVD deposition, the deposition is advantageously carried out on the ceramic powder with binder, for example on pressing granules (mean size of the order of a few tens of microns), or on injectable ceramic powders in the form of pellets (mean size of the order of a few millimetres) which are of larger dimensions. This approach thus brings together a mixed substrate comprising a ceramic powder and organic compounds, the temperature behaviour of which is poor, a maximum temperature being 45° C.

It is furthermore observed that the process of the invention makes it possible to achieve very satisfactory results, with respect to the novel or improved properties of the ceramic components, even with very small amounts of additional compound added to the ceramic. Thus, the colour of a ceramic component is not only improved compared to the existing solutions in that it is homogeneous and/or can permit new hues, but moreover this improved result is obtained by adding an additional colouring element or compound in a very small amount, in particular in an amount much lower than the amount of colouring pigments used with the conventional method.

For example, the PVD deposition process is used with a content by weight of additional element(s) or compound(s) of less than or equal to 5%, or even less than or equal to 3%, or even less than or equal to 2%. Advantageously, this content is greater than or equal to 0.01%. Advantageously, this content is between 0.01% and 5% inclusive, or even between 0.01% and 3% inclusive. It should be noted that all the contents by weight are measured on the finished ceramic component (after carrying out the fourth phase of the manufacturing process), or on the debound ceramic powder, i.e., not considering the weight of the binder. The ALD deposition process is even used to obtain still lower contents by weight, possibly of less than or equal to 5%, but also in particular less than or equal to 3% or 2%, or even less than or equal to 1%, or even less than or equal to 0.05%, or even less than or equal to 0.01%. Advantageously, these contents are greater than or equal to 1 ppm. Advantageously, these contents are between 1 ppm and 0.01% inclusive, or even between 1 ppm and 0.05% inclusive, or even between 1 ppm and 5% inclusive. The invention therefore has the advantage of obtaining very advantageous results with a small amount of additional compound material, or even a very small amount of material, without having to prepare an entire batch each time, and additionally making it possible to iteratively modify a basic batch.

Moreover, it is important to emphasize that the process of the invention makes it possible to obtain homogeneous distribution or good dispersion of an additional compound, and thus ultimately to obtain a ceramic component of homogeneous property (for example colour). It should be noted that, since the additional element is deposited after the second phase P2 of the process, therefore for example directly on granules, the additional compound is distributed over the surface of the granules owing to the deposition process used, and is thus distributed homogeneously over the ceramic powder with binder. The conformity of the deposition makes it possible to distribute the coating over the powder, and in the case of a metal coating, the powder becomes less electrostatic. It agglomerates less. The additional compound will in particular be distributed homogeneously in the finished sintered ceramic component.

Furthermore, the fact of carrying out the coating on a powder with binder, and not on a ceramic powder without binder, has the advantage of working on materials that are readily commercially available, and on particles of larger size, the recovery of which in the deposition equipment is easier.

In all the preceding cases, the analysis of the body obtained at the end of the fourth phase shows that the homogeneous distribution of the additional compound is retained in the finished ceramic component. If the PVD deposition has been carried out directly onto pressing granules, the microstructure of the ceramic component exhibits an ordered distribution of the particles of additional compound according to a superstructure that reflects the microstructure of the pressed granules (see FIGS. 2 and 3, which are commented on later). As a variant, this distribution of small particles of additional compound can be perfectly homogeneous by adding an attrition step after the deposition (see FIGS. 4 and 5). In the case of depositions onto the injection-moulding feedstock, the homogenization of the distribution of the particles of the additional compound in the material takes place in particular during the step of plasticizing of the molten mixture by the injection-moulding screw. Thus, in all cases, the ceramic component comprises an additional element distributed homogeneously in its volume, which allows it to have the property provided by this additional element distributed homogeneously in the ceramic component.

Finally, the deposition step E3 of the embodiment of the invention provides the following main advantages:

it makes it possible to obtain an addition of an additional element or compound that is perfectly controlled in terms of composition and amount and is in a very small amount, and therefore makes it possible to implement micro-metering of the additional compound;

it makes it possible to ultimately obtain a homogeneous distribution of the additional compound in the ceramic component;

it makes it possible to add a multitude of additional compounds, increasing the number of possible additional compounds in comparison to the existing solutions, increasing the possibilities for providing a ceramic component with certain properties;

it enables a reliable, repeatable and clean deposition of an additional compound.

The invention is illustrated below by examples which make it possible to manufacture a grey ceramic component, having hues that are impossible to produce with conventional techniques. In all these examples, the additional compound is platinum, which is deposited by PVD deposition onto a pressing powder. All the results obtained, in particular in terms of colour, are summarized in the table from FIG. 6.

Figure 2:
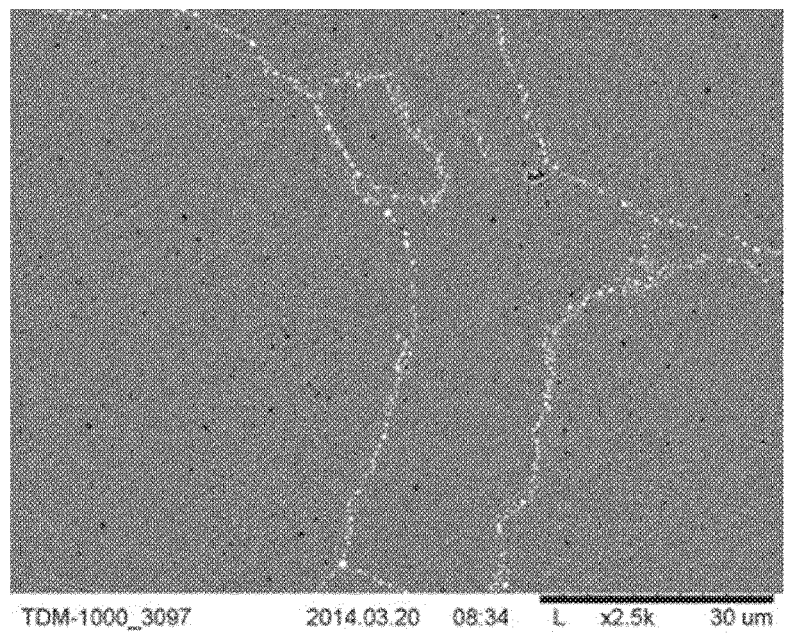
FIG. 2 represents a ceramic component obtained according to a first example according to an embodiment of the invention.

The first example is based on the use of a ceramic powder with binder in the form of granules, containing 3 mol % yttria-stabilized zirconia (TZ3Y) and comprising 0.25% by weight of alumina and 3% by weight of organic binders (REF1). 50 g of these granules are placed in the vibrating bowl of a PVD chamber containing a platinum cathode. The PVD chamber is evacuated and then the platinum is sputtered with an argon plasma. Inductively coupled plasma (ICP) analysis made it possible to assay the platinum content of these previously debound granules. The samples obtained from this example contain, overall, a platinum content of 2.26% by weight. The coated granules obtained are then pressed in a cylindrical mould on a uniaxial press. The resulting pellet is debound in air at 600° C. for 18 hours. Finally, it is sintered in air at 1450° C. with a hold of two hours. After sintering, the faces of the ceramic pellet are ground and then polished. The ceramic component obtained is grey in colour. FIG. 2 is an image, obtained by scanning electron microscopy, of the ceramic pellet obtained, which shows the distribution of the platinum particles (light dots). This figure makes it possible to highlight the ordered distribution of the platinum particles, in a microscopic superstructure, around the old pressing granules. At the scale of the component, the distribution of the particles is homogeneous.

Figure 3:
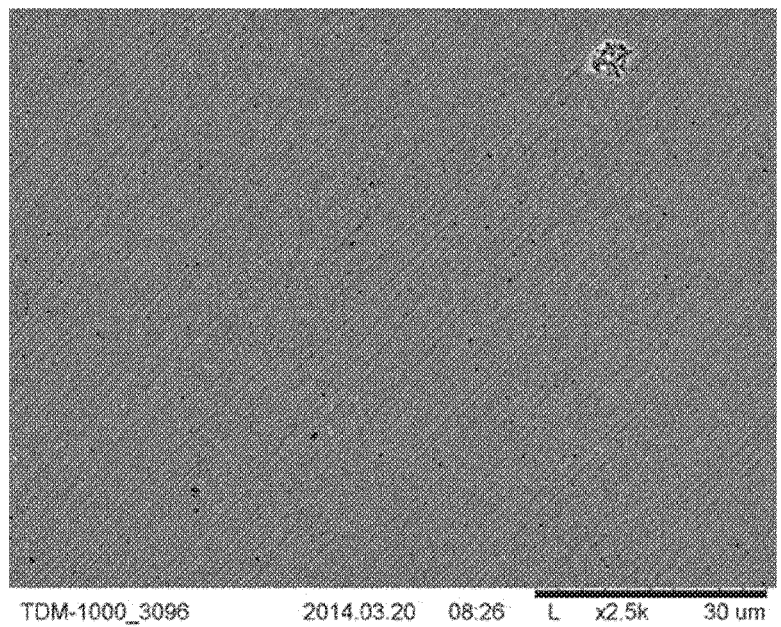
FIG. 3 represents a ceramic component obtained according to a second example according to an embodiment of the invention.

The second example is made from a bound pressing powder containing 3 mol % yttria-stabilized zirconia (TZ3Y) and comprising 0.25% by weight of alumina and 3% by weight of organic binders, in the form of granules (REF1). 50 g of these granules are placed in the vibrating bowl of a PVD chamber containing a platinum cathode. The PVD chamber is evacuated and then the platinum is sputtered with an argon plasma. Inductively coupled plasma (ICP) analysis made it possible to assay the platinum content of these previously debound granules. The samples from this example contain, overall, a platinum content of 0.11% by weight. The coated granules obtained are then pressed in a cylindrical mould on a uniaxial press. The resulting pellet is debound in air at 600° C. for 18 hours. Finally, it is sintered in air at 1450° C. with a hold of two hours. After sintering, the faces of the pellet are ground and then polished. The ceramic component obtained is grey in colour. FIG. 3 is an image, obtained by scanning electron microscopy, of the ceramic pellet obtained, which shows the distribution of the platinum particles (light dots) at the grain boundaries. At the scale of the component, this distribution is homogeneous. Owing to the very low content of platinum, these platinum particles are not very visible.

Figure 4:
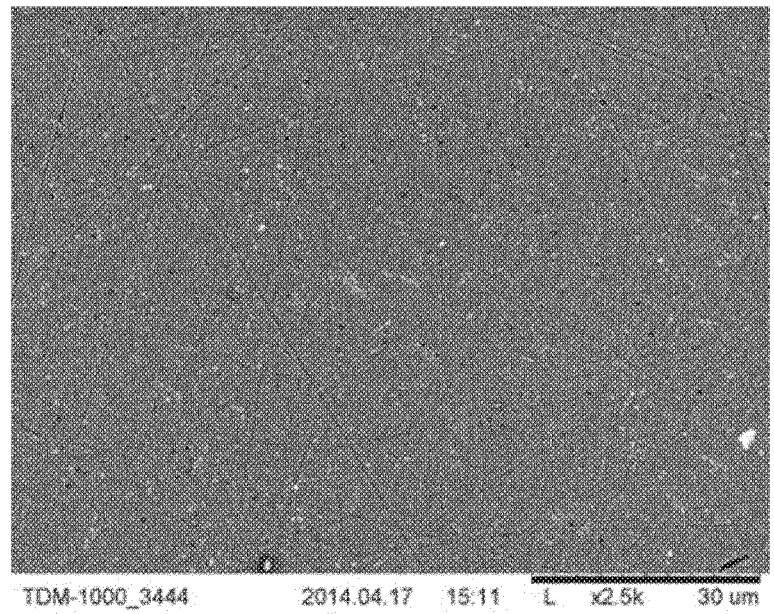
FIG. 4 represents a ceramic component obtained according to a third example according to an embodiment of the invention.

In the third example, a portion of the powder obtained when carrying out example 1 is withdrawn. Next, a step of debinding followed by an attrition (mixing, wet grinding) and binding treatment are added. In this treatment, 0.47 g of PVA, 0.71 g of PEG 20 000 and 170 ml of DI (deionized) water are added to 39.4 g of debound powder from example 1. The suspension thus obtained is placed in the zirconia bowl of an attritor with 1 kg of zirconia beads to be attrited for 1 hour at 400 rpm. The suspension is then recovered in order to be dried and granulated by spray drying using a "spray dryer". The granules thus obtained are then pressed in a cylindrical mould on a uniaxial press. The resulting pellet is debound in air at 600° C. for 18 hours. Finally, it is sintered in air at 1450° C. with a hold of two hours. The samples from this example still contain, overall, the same content of 2.26% by weight of platinum as in example 1. After sintering, the faces of the pellet are ground and then polished. The ceramic component obtained is grey in colour. FIG. 4 is an image, obtained by scanning electron microscopy, of the ceramic pellet obtained, which shows the microscopically homogeneous distribution of platinum particles (light dots) within the zirconia grains. The differences in colour between the polished ceramics from examples 1 and 3 are visually imperceptible ($\Delta E < 1$) and are within the measurement error given by the device; it is therefore considered that, to the human eye, the distribution of the platinum particles in these two samples is equivalent in terms of resulting colour.

Figures 5, 6:
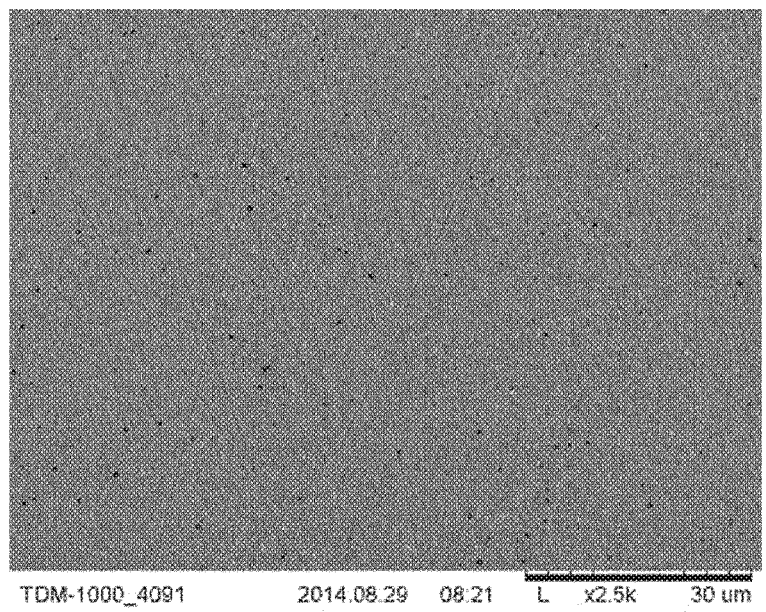
FIG. 5 represents a ceramic component obtained according to a fourth example according to an embodiment of the invention.
FIG. 6 consists of a table of results of ceramic components obtained according to seven exemplary implementations of an embodiment of the invention.

In the fourth example, a portion of the powder obtained when carrying out the second example is withdrawn. Next, a step of debinding followed by an attrition and binding treatment are added. In this treatment, 0.46 g of PVA, 0.69 g of PEG 20 000 and 166 ml of DI (deionized) water are added to 38.5 g of debound powder from example 2. The suspension thus obtained is placed in the zirconia bowl of an attritor with 1 kg of zirconia beads to be attrited for 1 hour at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of two hours. The samples from this example still contain, overall, the same content of 0.11% by weight of platinum as in example 2. After sintering, the faces of the pellet are ground and then polished. The ceramic component obtained is grey in colour. FIG. 5 is an image, obtained by scanning electron microscopy, of the ceramic pellet obtained, which shows the microscopically homogeneous distribution of platinum particles (light dots) within the zirconia grains. Owing to the very low content of platinum, these platinum particles are not very visible on this scale. The differences in colour between the polished ceramics from examples 2 and 4 are visually imperceptible ($\Delta E < 1$) and are within the measurement error given by the device; it is therefore considered that, to the human eye, the distribution of the platinum particles in these two samples is equivalent in terms of resulting colour.

In the fifth example, 3.32 g of the powder obtained when carrying out the third example are withdrawn and debound in order to be mixed with 96.68 g of commercial powder (3 mol % yttria-stabilized zirconia, unbound) before undergoing an attrition treatment. Then 1.2 g of PVA, 1.8 g of PEG 20 000 and 200 ml of DI (deionized) water are added to 100 g of powder obtained. The suspension thus obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of two hours. The samples from this example contain a content of 0.075% by weight of platinum. After sintering, the faces of the pellet are ground and then polished. The ceramic component obtained is grey in colour.

In the sixth example, 2.21 g of the powder obtained when carrying out the third example are withdrawn and debound in order to be mixed with 97.79 g of commercial powder (3 mol % yttria-stabilized zirconia, unbound) before undergoing an attrition treatment. Then 1.2 g of PVA, 1.8 g of PEG 20 000 and 200 ml of DI (deionized) water are added to 100 g of powder obtained. The suspension thus obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of two hours. The samples from this example contain a content of 0.05% by weight of platinum. After sintering, the faces of the pellet are ground and then polished. The ceramic component obtained is grey in colour.

In the seventh example, 0.77 g of the powder obtained when carrying out the third example is withdrawn and debound in order to be mixed with 99.23 g of commercial powder (3 mol % yttria-stabilized zirconia, unbound) before undergoing an attrition treatment. Then 1.2 g of PVA, 1.8 g of PEG 20 000 and 200 ml of DI (deionized) water are added to 100 g of powder obtained. The suspension thus obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of two hours. The samples from this example contain a content of 0.02% by weight of platinum. After sintering, the faces of the pellet are ground and then polished. The ceramic component obtained is grey in colour.

Figure 7:
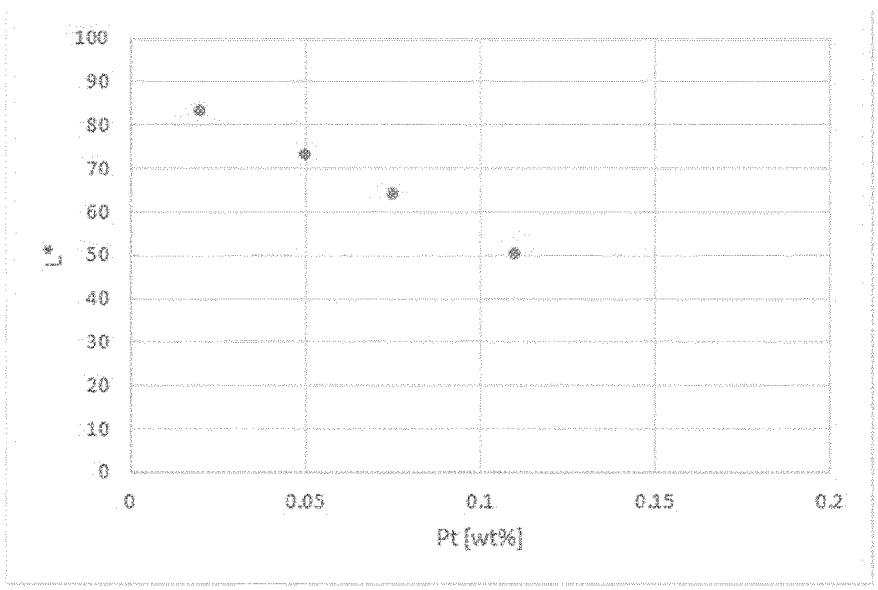
FIG. 7 represents the change in the lightness as a function of the platinum content for the ceramic components of examples 4 to 7 obtained by an embodiment of the invention.
Figure 8:
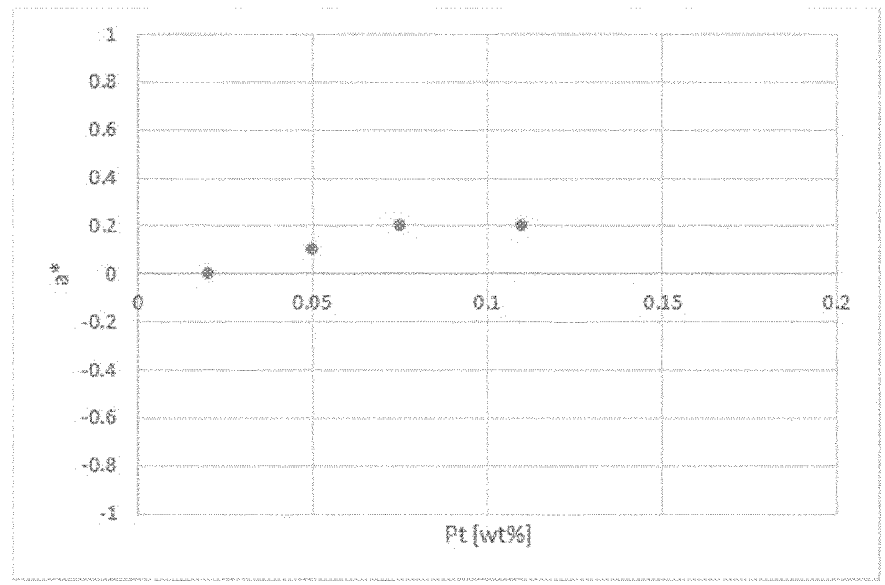
FIG. 8 represents the change in the chromaticity parameter a* as a function of the platinum content for the ceramic components of examples 4 to 7 obtained by an embodiment of the invention.

The table from FIG. 6 represents the results of the preceding seven examples. It is interesting to note that all these examples make it possible to obtain a grey ceramic. Thus, generally, one embodiment of the invention advantageously makes it possible to manufacture a grey ceramic, characterized by the two parameters a* and b* between −1 and 1 inclusive. Moreover, it is interesting to note that the hue varies as a function of the platinum content, as is summarized by FIGS. 7 to 9.

As a variant, one embodiment of the invention may make it possible to manufacture a grey ceramic component, characterized by the two parameters a* and b* between −3 and 3 inclusive, or even between −2 and 2 inclusive, or even between −0.5 and 0.5 inclusive.

It should be noted that the attrition after the addition of the platinum makes it possible to better distribute the platinum in the material (see FIGS. 2 to 5) and does not significantly modify the colour of the ceramic obtained in these examples.

A very slight increase in the density of the samples, linked to the attrition, is also observed. However, this attrition remains optional.

Figures 9, 10, 11:
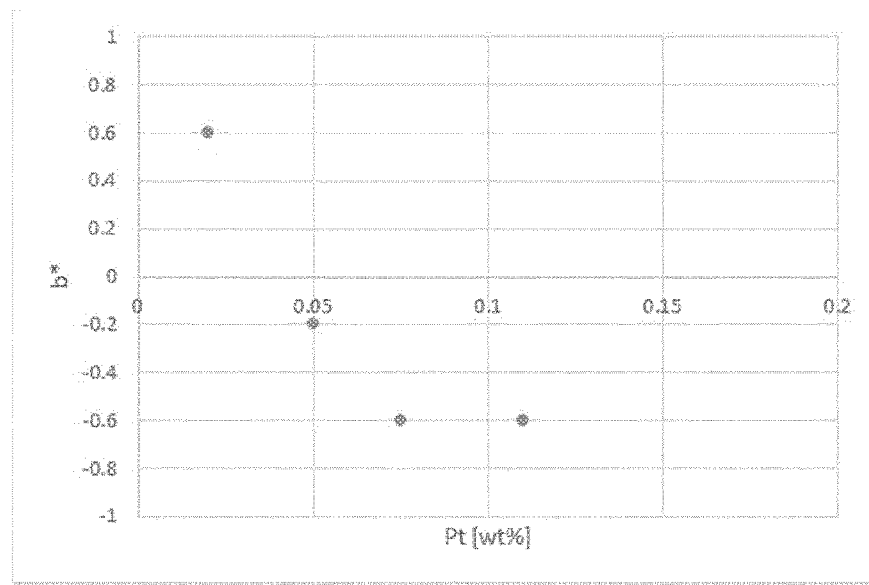
FIG. 9 represents the change in the chromaticity parameter b* as a function of the platinum content for the ceramic components of examples 4 to 7 obtained by an embodiment of the invention.
FIG. 10 consists of a table of results of ceramic components obtained according to exemplary implementations of an embodiment of the invention.
FIG. 11 consists of a table of results of ceramic components obtained according to three exemplary implementations of an embodiment of the invention.

Naturally, the invention is not limited to the manufacture of a ceramic component containing platinum as additional compound. It is possible to obtain a grey colour with an additional compound other than platinum, for example with rhodium, palladium or any other grey noble metal that does not react with the other components of the ceramic or the sintering atmosphere. Furthermore, the invention is not limited to the manufacture of a grey ceramic component. Indeed it is possible to obtain numerous colours by varying the additional compound. Thus, the table from FIG. 10 gives several examples of ceramic components obtained by the process according to an embodiment of the invention with various additional compounds. More specifically, tests of deposition of various additional compounds by PVD depositions were carried out directly on ceramic injection-moulding feedstocks based on 3 mol % yttria-stabilized zirconia, with or without addition of alumina. It is observed that the addition of iron Fe gives a very slightly yellow ceramic. The addition of chromium Cr to a pure stabilized zirconia also gives a yellow ceramic with a slight red tendency. Chromium deposited on a zirconia to which 2 wt % alumina has been added gives a lighter, but redder material. The addition of vanadium V makes the ceramic yellow and the addition of aluminium Al has virtually no effect on the base colour.

Optionally, the manufacturing process may comprise a prior step E1 of adding another compound to the ceramic powder without binder, for example the addition of colouring pigments or any other compound according to the conventional approach recalled above or according to other techniques known to those skilled in the art, for example by salt precipitation. Indeed, the invention remains compatible with all other existing processes, and can be complementary thereto, for example for the enrichment thereof. This step E1 may be carried out at any suitable moment in the manufacturing process.

As a variant and optionally, the manufacturing process may comprise a prior step E1 of adding another additional element or compound to the ceramic powder with binder, in particular by an atomic layer deposition ALD. Particularly, an ALD deposition step may make it possible to render the surface of a ceramic powder conductive, for example by adding a metallic additional compound. This offers the advantage of limiting the risks of agglomeration of the ceramic powder with binder, in particular subsequently within a PVD chamber, since the particles of this ceramic powder with binder have an electrostatic nature which tends to bring them together and to naturally form agglomerates, which is disadvantageous for the homogeneous coating thereof with an additional compound. It should be noted that this first conductive element does not need to cover the entire surface of the powder grains in order to be effective. It is observed that the deposition of an additional compound by a PVD deposition on the powder with binder, during the deposition step E3, is facilitated by the first thin layer formed by the ALD deposition, forming a conductive sublayer that limits the agglomeration of the particles. It should be noted that the compound deposited by the ALD deposition may be identical to the one which will be deposited by the PVD deposition. As a variant, the two compounds deposited by ALD and by PVD are different, in order to combine the properties thereof.

As a variant, the deposition of an additional element or compound by ALD via the prior step E1 may be carried out on a ceramic powder without binder, therefore before carrying out the second phase P2 of the process. The ceramic powder thus enriched may undergo a succession of dispersion/wet grinding steps during the second phase P2, in order to bind it with an organic compound, before spray drying it in order to make therefrom, for example, granules at the end of the second phase P2 of the process. This second phase P2 thus makes it possible to homogeneously distribute said additional element or compound.

As is mentioned above, the prior art solution for colouring a ceramic component is complex and is not always satisfactory. Moreover, when it is desired to modify, even slightly, a hue of a ceramic component previously coloured using pigments according to the prior art, it appears very difficult to do so with the conventional technique, in particular because the pigments have a tendency to react with one another during the sintering. Thus, according to the prior art, it is long and laborious to modify the intensity (lightness) and/or the hue of the colour of a coloured ceramic: indeed, each attempt requires the creation of a new batch of ceramic powder having a new chemical composition, then the manufacture of an injection-moulding feedstock, up to the creation of the finished (sintered and polished) ceramic components.

With the process of the invention, it becomes much easier to carry out such a modification of colour or intensity. More generally, it becomes easy to carry out any other modification of a property of the ceramic component.

Thus, one embodiment of the invention is based on a process for manufacturing a ceramic powder or a ceramic component, in particular based on zirconia and/or alumina and/or strontium aluminate, which comprises the following steps:

providing a ceramic powder with binder containing colouring pigments or more generally at least one added or additional compound that would make it possible to obtain a ceramic component of a first colour or more generally endowed with a first property, by manufacturing a ceramic component from this ceramic powder with binder;

depositing E3 at least one, colouring or other, additional element or compound on said ceramic powder with binder by a physical vapour deposition PVD and/or by a chemical vapour deposition CVD and/or by an atomic layer deposition ALD;

completing the manufacture of the ceramic component from the ceramic powder with binder including the deposited additional compound in order to obtain a ceramic component, the colour of which is a second colour, different from the first colour, or more generally that is endowed with a second property, different from the first property.

By means of such a process, a first property obtained from a commercial ceramic powder with binder can easily be modified to a second property by adding an additional compound according to an embodiment of the invention. As this embodiment of the invention uses a step E3 that is easy to implement, to control and to reproduce, it becomes easy to carry out multiple tests to obtain, by trial and error, the desired final property for the ceramic component, without this requiring laborious intervention at the ceramic powder preparation stage.

Thus, the process for manufacturing a ceramic component may repeat steps of depositing at least one additional compound on said ceramic powder with binder, modifying the content of said additional compound, or even the additional compound itself, and of completing the manufacture of the ceramic component, until it has come sufficiently close to the desired result.

In practice, it is therefore possible to implement a step of selecting a ceramic powder with binder containing colouring pigments that make it possible to obtain a first colour close to a desired second colour, then to modify the colour by adding an additional colouring compound, until it has come sufficiently close to the desired colour. The same approach can be implemented for modifying any property other than colour, as mentioned previously.

Advantageously, the at least one additional compound is chosen such that it does not react with the added compounds already present in the ceramic powder with binder, for example colouring pigments.

The pigments present in the ceramic powder with binder may comprise one or more elements from among a metal oxide, a rare-earth oxide, a cobalt aluminate and/or phosphorescent pigments.

The following three examples, numbered examples eight to ten, illustrate this principle, in the case of a ceramic component containing a cobalt aluminate (blue pigment). The results are presented in the table from FIG. 11.

In the eighth example, a ceramic component is initially coloured using a commercial ceramic powder of 3 mol % yttria-stabilized zirconia (TZ3Y) containing 0.25% by weight of alumina, to which was added an amount of 3% by weight of organic binders and also 1% by weight of $CoAl_2O_4$ pigment by the conventional wet method (REF2). The resulting suspension is dried and granulated by spray drying. The granules are then pressed to obtain a sample. This sample is debound and sintered to obtain a ceramic component that is blue in colour, characterized by the following CIE L*a*b* parameters (50.5; −0.7; −19.4).

According to the embodiment of the invention, the ceramic powder with binder described above (REF2) is first debound; 99 g thereof are withdrawn. The powder obtained during the first example is also debound; 1 g thereof is withdrawn. The two withdrawn samples are combined. Then 1.2 g of PVA, 1.8 g of PEG 20 000, and 200 ml of DI water are added to 100 g of this modified ceramic powder. The suspension thus obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of two hours, according to a cycle known to a person skilled in the art. The samples from this eighth example contain 0.02% by weight of platinum. After sintering, the faces of the pellet are ground and then polished. The modified colour is then noted (see FIG. 11).

The ninth example firstly considers the manufacture of a 3 mol % yttria-stabilized zirconia (TZ3Y) powder containing 3% by weight of organic binders and also 0.5% by weight of $CoAl_2O_4$ pigments incorporated by the conventional wet method (REF3). The resulting suspension is dried and granulated by spray drying. The granules are then pressed to obtain a sample. This sample is debound and sintered. The ceramic obtained is blue in colour, with CIE L*a*b* parameters (52.0; −1.9; −15.5).

Next, granules (REF3) used for manufacturing this zirconia-based ceramic component are debound. 1 g of the debound powder from the first example is added to 99 g of this debound ceramic powder. Subsequently, 1.2 g of PVA, 1.8 g of PEG 20 000, and 200 ml of DI water are added to these 100 g of mixed powder. The suspension obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of 2 hours. The samples from this ninth example contain 0.02% by weight of platinum. After sintering, the faces of the pellet are ground and then polished. The ceramic component thus has a modified colour (see parameters presented in FIG. 11).

In the tenth example, a ceramic component is formed from a commercial powder of 3 mol % yttria-stabilized zirconia (TZ3Y) containing 0.25% by weight of alumina, containing 3% by weight of organic binders and 0.5% by weight of $CoAl_2O_4$ pigment, which were added by the conventional wet method (REF3).

The resulting suspension is dried and granulated by spray drying. The granules are then pressed to obtain a sample. This sample is debound and sintered. The ceramic obtained is blue in colour, with CIE L*a*b* parameters (52.0; −1.9; −15.5).

According to the embodiment, granules (REF3) used to manufacture the preceding ceramic component are firstly debound. Next, 1.8 g of the debound ceramic powder from example 1 are added to 98.2 g of this debound ceramic powder. Then 1.2 g of PVA, 1.8 g of PEG 20 000, and 200 ml of DI water are added to 100 g of the modified ceramic powder. The suspension thus obtained is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered in air at 1450° C. with a hold of 2 hours. The samples from this tenth example therefore contain 0.036% by weight of platinum. After sintering, the faces of the pellet are ground and then polished. The ceramic component thus has a modified colour (see parameters presented in FIG. 11).

The preceding three examples are based on the use of the embodiment of the invention to easily achieve a desired colour, starting from a pigmented ceramic powder, the colour of which is ultimately modified.

More generally, the embodiment of the invention is simply compatible with all other techniques of adding at least one compound to a ceramic powder with binder. Thus, the invention may be combined with any other technique, in particular with a conventional approach, to obtain any type of ceramic having novel properties.

By way of example, an eleventh example considers a ceramic powder of 3 mol % yttria-stabilized zirconia, to which was added an amount of 30% by weight of luminescent pigment $Sr_4Al_{14}O_{25}$:Dy,Eu and also 3% by weight of organic binders by the conventional wet method (REF4). The resulting suspension is dried and granulated by spray drying. The granules are pressed, debound in air and sintered at 1450° C. for 2 hours under a particular atmosphere. This conventional process makes it possible to obtain a ceramic having a colour defined by CIE L*a*b* parameters (94.0; −4.7; 6.7).

As a variant of an embodiment of the invention, the granules of the composite ceramic powder used above (REF4) are debound. Then 1 g of the debound powder from the first example is added to 99 g of this powder. Subsequently, 1.2 g of PVA, 1.8 g of PEG 20 000 and 200 ml of DI water are added to 100 g of the powder obtained. The resulting suspension is placed in the zirconia bowl of an attritor with 1 kg of zirconia beads to be attrited for 70 minutes at 400 rpm. The suspension is then recovered in order to be dried and granulated by spray drying using a "spray dryer". The granules obtained are then pressed in a cylindrical mould on a uniaxial press. The resulting pellet is debound in air at 600° C. for 18 hours. Finally, it is sintered at 1450° C. with a hold of 2 hours in a particular atmosphere. The samples from this eleventh example contain 0.02% by weight of platinum. After sintering, the faces of the pellet are ground and then polished. This thus results in a coloured and luminescent ceramic component, via a combination of the invention with a conventional process, the precise characteristics of which are summarised in the table from FIG. 12. As a variant, other colours could be imparted to such a phosphorescent or luminescent ceramic component by the addition of other additional elements or compounds.

The preceding examples are based on the use of an additional compound to obtain a coloured ceramic component, because such examples have the advantage of illustrating the invention in a manner that is very meaningful since it is visual.

Examples below make it possible to manufacture a grey ceramic component, with hues that are impossible to manufacture with conventional techniques, via the specific use of the ALD process, on a powder without binder. All the results obtained, in particular in terms of colour, are summarized in the table from FIG. 15.

The first example is based on the use of a ceramic powder with binder removed, composed of 3 mol % yttria-stabilized zirconia (TZ3YS). 10 g of this powder are placed in the vibrating bowl of an ALD chamber, which is evacuated, in order to start the deposition of platinum via the ALD process. 50 deposition cycles are carried out.

Figures 12, 13:
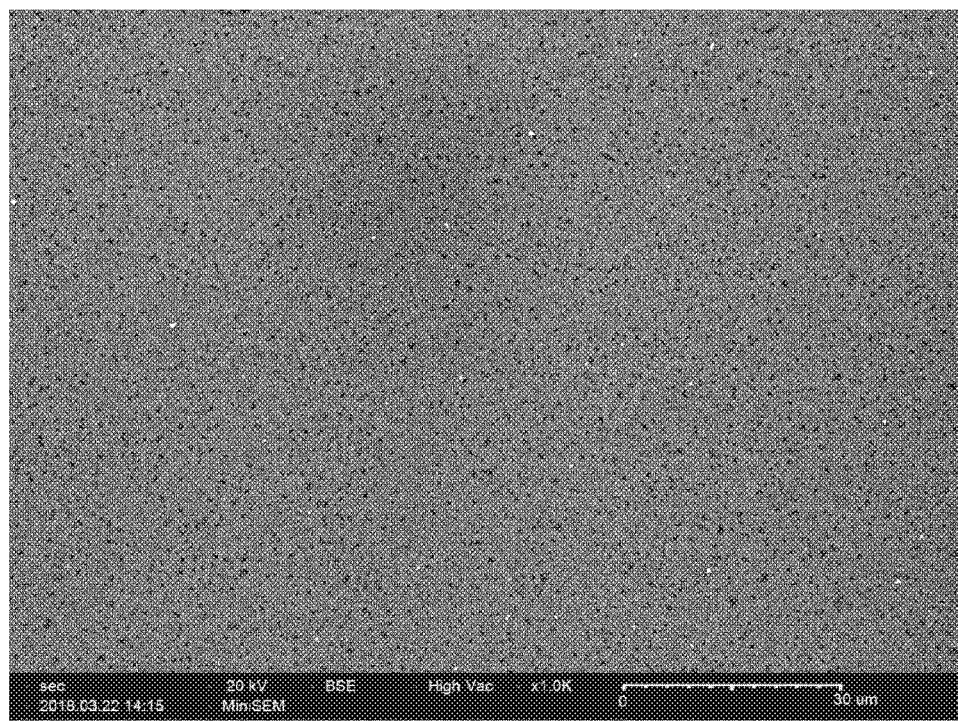
FIG. 12 consists of a table of results of a ceramic component obtained according to an exemplary implementation of an embodiment of the invention.
FIG. 13 represents a ceramic component obtained according to a first example according to an embodiment of the invention.

The ceramic powder thus coated then undergoes an attrition (mixing, wet grinding) and binding treatment. In this treatment, 0.6 g of PVA, 0.9 g of PEG 20 000 and 116 ml of deionized water are added to 50.4 g of said platinum-covered ceramic powder. The suspension thus obtained is placed in the zirconia bowl of an attritor with 1 kg of zirconia beads to be attrited/ground for 2 hours at 400 rpm. The suspension is then recovered in order to be dried and granulated by spray drying using a "spray dryer". The granules thus obtained are then pressed in a cylindrical mould on a uniaxial press. The resulting pellet is debound in air at 600° C. for 18 hours. Finally it is sintered in air at 1450° C. with a hold of 2 hours. After sintering, the faces of the ceramic pellet are ground and then polished. The ceramic component obtained is grey in colour. FIG. 13 is an image, obtained by scanning electron microscopy (SEM), of the sintered ceramic pellet, which shows the distribution of the platinum particles (light dots). This figure makes it possible to demonstrate the homogeneous distribution of the platinum particles. Specifically, on the scale of the component, the distribution of these particles is considered to be homogeneous. The resulting colour appears homogeneous to the naked eye.

Figures 14, 15:
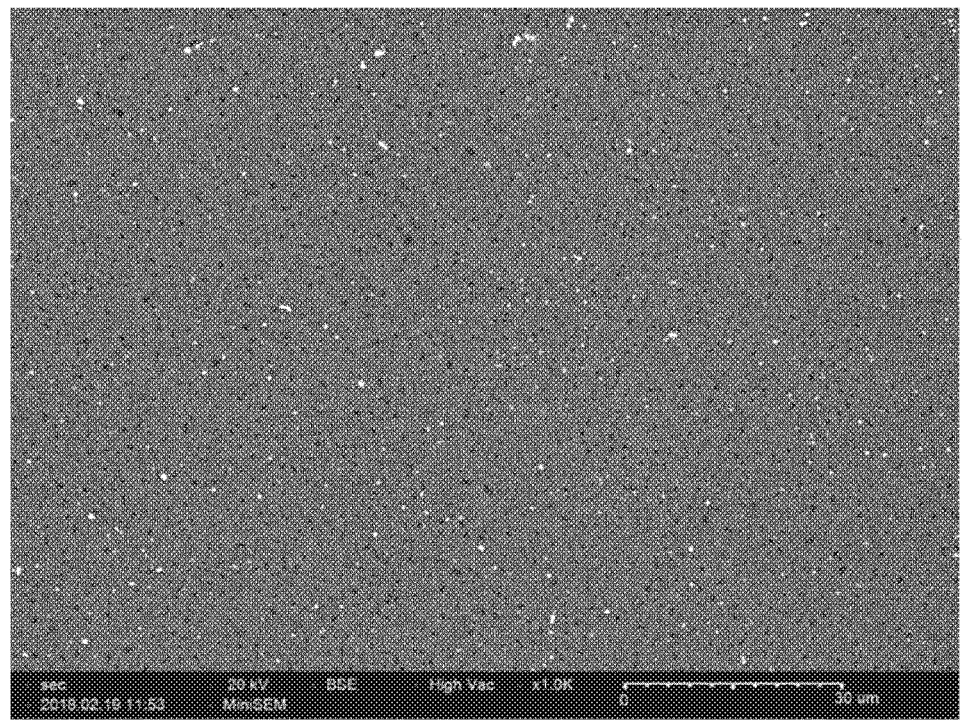
FIG. 14 represents a ceramic component obtained according to a second example according to an embodiment of the invention.
FIG. 15 consists of a table of results of ceramic components obtained according to the two preceding exemplary implementations of an embodiment of the invention.

The colour and the composition are given in the table from FIG. 15 under the reference 1 ALD 50.

The second example is based on the use of a ceramic powder with binder removed, composed of 3 mol % yttria-stabilized zirconia (TZ3YS). 10 g of this powder are placed in the vibrating bowl of an ALD chamber, which is evacuated, in order to start the deposition of platinum via the ALD process. 200 deposition cycles are carried out. The ceramic powder thus coated then undergoes an attrition (mixing, wet grinding) and binding treatment. In this treatment, 0.6 g of PVA, 0.9 g of PEG 20 000 and 120 ml of deionized water are added to 50.4 g of said platinum-covered ceramic powder. The suspension thus obtained is placed in the zirconia bowl of an attritor with 1 kg of zirconia beads to be attrited/ground for 2 hours at 400 rpm. The suspension is then recovered in order to be dried and granulated by spray drying using a "spray dryer". The granules thus obtained are then pressed in a cylindrical mould on a uniaxial press. The resulting pellet is debound in air at 600° C. for 18 hours. Finally, it is sintered in air at 1450° C. with a hold of 2 hours. After sintering, the faces of the ceramic pellet are ground and then polished. The ceramic component obtained is grey in colour. FIG. 14 is an image, obtained by scanning electron microscopy (SEM), of the sintered ceramic pellet, which shows the distribution of the platinum particles (light dots). This figure makes it possible to demonstrate the homogeneous distribution of the platinum particles. Specifically, on the scale of the component, the distribution of these particles is considered to be homogeneous. The resulting colour appears homogeneous to the naked eye. The colour and the composition are given in the table from FIG. 15 under the reference 2 ALD 200.

The table from FIG. 15 represents the results of the preceding two examples. It is interesting to note that these examples make it possible to obtain a grey ceramic. Thus, generally, one embodiment of the invention advantageously makes it possible to manufacture a grey ceramic, characterized by the two parameters a* and b* between −1 and 1 inclusive.

As a variant, one embodiment of the invention may make it possible to manufacture a grey ceramic component, characterized by the two parameters a* and b* between −3 and 3 inclusive, or even between −2 and 2 inclusive, or even between −0.5 and 0.5 inclusive.

Furthermore, the colour of a ceramic component is particular important for a timepiece or jewellery part, because it makes it possible to obtain desired esthetics. Thus, the invention is particularly advantageous for manufacturing a horological or jewellery component. This horological component may in particular be a watch bezel, a dial, an index, a winding crown, a push button or any other horological casing element or element of a horological movement. The invention also relates to a timepiece, notably a watch, comprising such a horological component.

Naturally, the invention is not limited to a particular colour, nor to a given property of a ceramic component. Indeed, the concept of the invention is to multiply and simplify the possible enrichment of a ceramic component, and the invention ultimately enables the manufacture of a multitude of novel ceramic components.

In particular, a ceramic component obtained by an embodiment of the invention comprises at least one particular property obtained by a very small amount of an additional compound distributed in the ceramic component. This very small amount is less than or equal to 5% by weight, or less than or equal to 3% by weight, or less than or equal to 1% by weight, or less than or equal to 0.05% by weight, or less than or equal to 0.01% by weight, relative to the total weight of the completed ceramic compound. Furthermore, this amount will advantageously be greater than or equal to 1 ppm, or greater than or equal to 10 ppm.

Furthermore, the invention also relates to a device for manufacturing a ceramic component wherein it uses the ceramic component manufacturing process. To this end, the manufacturing device comprises a chamber for carrying out physical vapour deposition (PVD) or chemical vapour deposition (CVD) or an atomic layer deposition (ALD).

The invention claimed is:

1. A process for manufacturing a ceramic component, wherein the process comprises:
    manufacturing a ceramic powder with binder comprising at least one additional element or compound by depositing the at least one additional element or compound on a base ceramic powder with binder by at least one selected from the group consisting of:
        a physical vapor deposition (PVD),
        a chemical vapor deposition (CVD), and
        an atomic layer deposition (ALD),
    after performing the depositing of the at least one additional element or compound,
        performing a provisional shaping of the ceramic powder with binder comprising the at least one additional element or compound, then
        debinding the provisionally shaped ceramic component including eliminating organic compound(s) followed by sintering the ceramic component.

2. The process for manufacturing a ceramic component as claimed in claim 1, wherein the depositing comprises adding the at least one additional element or compound in a total amount in the ceramic powder, excluding organic compound(s), of less than or equal to 5% by weight.

3. The process for manufacturing a ceramic component as claimed in claim 1, wherein the depositing comprises adding the at least one additional element or compound in a total amount of greater than or equal to 1 ppm, excluding organic compound(s).

4. The process for manufacturing a ceramic component as claimed in claim 1, wherein the depositing comprises depositing the at least one additional element or compound on the base ceramic powder with binder by physical vapor deposition (PVD) and/or by chemical vapor deposition (CVD), in an amount of between 0.01% and 5% inclusive by weight, excluding organic compound(s).

5. The process for manufacturing a ceramic component as claimed in claim 1, wherein the depositing comprises depositing the at least one additional element or compound on the base ceramic powder with binder by an atomic layer deposition (ALD) in an amount of between 1 ppm and 5% inclusive by weight, excluding organic compound(s).

6. The process for manufacturing a ceramic component as claimed in claim 1, wherein the at least one additional element or compound is or comprises an element or compound selected from the group consisting of metals, metal alloys, oxides, nitrides and carbides.

7. The process for manufacturing a ceramic component as claimed in claim 6, wherein the at least one additional element or compound is or comprises a metal selected from one of the following four lists:
    a noble metal having a high melting point, selected from the group consisting of platinum, rhodium, osmium, palladium, ruthenium, and iridium;
    a metal selected from the group consisting of gold, aluminum, silver, rhenium, titanium, tantalum and niobium;
    a transition metal selected from the group consisting of aluminum, iron, chromium, vanadium, manganese, cobalt, nickel and copper;
    a lanthanide selected from the group consisting of lanthanum, cerium, praseodymium, neodymium, promethium, samarium, europium, gadolinium, terbium, dysprosium, holmium, erbium, thulium, ytterbium and lutetium.

8. The process for manufacturing a ceramic component as claimed in claim 1, wherein the at least one additional element or compound is a metal alloy, obtained by direct deposition of the metal alloy on the base ceramic powder with binder or by a combination of successive or simultaneous depositions of several elements of the metal alloy on the base ceramic powder with binder.

9. The process for manufacturing a ceramic component as claimed in claim 1, wherein the at least one additional element or compound is an oxide, a carbide or a nitride of one or more metals, obtained by direct deposition of the oxide, carbide or nitride on the base ceramic powder with binder or by reaction of a metallic deposition with a reactive atmosphere.

10. The process for manufacturing a ceramic component as claimed in claim 1, wherein the depositing comprises simultaneous or successive deposition of several different additional elements or compounds.

11. The process for manufacturing a ceramic component as claimed in claim 1, wherein the base ceramic powder with binder comprises an organic compound in an amount of between 1% and 4% inclusive by weight or between 12% and 25% inclusive by weight.

12. The process for manufacturing a ceramic component as claimed in claim 1, wherein the process comprises:
    firstly, preparing the base ceramic powder, then
    optionally, performing a preliminary depositing of the at least one additional element or compound on the base ceramic powder by an atomic layer deposition (ALD), then
    secondly, incorporating the binder comprising an organic material into the base ceramic powder comprising the at least one additional element or compound; then,
    performing the depositing of the at least one additional element or compound on the ceramic powder with binder.

13. The process for manufacturing a ceramic component as claimed in claim 1, wherein the process comprises adding coloring pigments or phosphorescent pigments to the bound or to the base ceramic powder without binder, before or after performing the depositing of the at least one additional element or compound.

14. The process for manufacturing a ceramic component as claimed in claim 1, wherein:
    prior to depositing the at least one additional element or compound on the base ceramic powder, the base ceramic powder with binder includes at least one compound whose presence makes it possible to obtain a ceramic component of a first color;
    wherein the process further comprises:
    after performing the depositing of the at least one additional element or compound on the ceramic powder with binder, completing manufacture of the ceramic component by performing a provisional shaping of the ceramic powder with binder comprising the at least one additional element or compound, then debinding the provisionally shaped ceramic component including eliminating organic compound(s) followed by sintering the ceramic component,
    wherein the ceramic component is of a second color, different from the first color.

15. The process for manufacturing a ceramic component as claimed in claim 14, wherein the process comprises repeating the depositing of the at least one additional element or compound on the base ceramic powder with binder, wherein the several depositions of the at least one additional compound differ by varying the amount and/or the nature of the at least one additional element or compound, until the second color of the ceramic component has come sufficiently close to a desired color after completion of the manufacture of the ceramic component.

16. The process for manufacturing a ceramic component as claimed in claim 14, wherein the process comprises selecting the base ceramic powder with binder containing at least one compound that makes it possible to obtain a first property that comes close to a desired second property.

17. A process for manufacturing a ceramic component, wherein the process comprises:
    manufacturing a ceramic powder with binder comprising at least one additional element or compound by depositing the at least one additional element or compound on a base ceramic powder with binder by at least one selected from the group consisting of:
        a physical vapor deposition (PVD),
        a chemical vapor deposition (CVD), and
        an atomic layer deposition (ALD),
    after performing the depositing of the at least one additional element or compound,
        performing a provisional shaping of the ceramic powder with binder comprising the at least one additional element or compound, then
        debinding the provisionally shaped ceramic component including eliminating organic compound(s) followed by sintering the ceramic component,
    wherein the ceramic component is selected from the group consisting of a watch bezel, a dial, an index, a winding crown, a push button, an horological casing element and an element of a horological movement.

18. The process for manufacturing a ceramic component as claimed in claim 1, wherein the ceramic powder is based on at least one selected from the group consisting of zirconia, alumina and strontium aluminate.

* * * * *